US005298828A

United States Patent [19]

Radovanovich

[11] Patent Number: 5,298,828

[45] Date of Patent: Mar. 29, 1994

[54] ULTRASONIC ELECTROACOUSTIC TRANSDUCER

[75] Inventor: George D. Radovanovich, New South Wales, Australia

[73] Assignee: Commonwealth Scientific and Industrial Research Organisation, Campbell, Australia

[21] Appl. No.: 861,841

[22] PCT Filed: Oct. 12, 1990

[86] PCT No.: PCT/AU90/00489

§ 371 Date: Jun. 17, 1992

§ 102(e) Date: Jun. 17, 1992

[87] PCT Pub. No.: WO92/08329

PCT Pub. Date: May 14, 1992

[30] Foreign Application Priority Data

Nov. 2, 1990 [AU] Australia ........................ PK3191/90

[51] Int. Cl.[5] ........................................ H01L 41/08

[52] U.S. Cl. ........................ 310/319; 310/317; 310/334; 310/366

[58] Field of Search ............... 310/316, 317, 319, 334, 310/336, 337, 339, 366

[56] References Cited

U.S. PATENT DOCUMENTS 2,939,106 5/1960 Mason ................................ 310/317
3,593,048 7/1971 Dunegan ............................ 310/319
3,980,905 9/1976 Miller .................................. 310/317
4,181,864 1/1980 Etzold ................................ 310/319
4,356,422 10/1982 Van Maanen .................. 310/334 X
4,656,870 4/1987 Ruthrof et al. ..................... 310/319
4,751,419 6/1988 Murase ................................ 310/319
4,801,831 1/1989 Beauducel et al. ................. 310/319
5,036,240 7/1991 Lew ............................... 310/319 X

*Primary Examiner*—Mark O. Budd
*Attorney, Agent, or Firm*—Ladas & Parry

[57] ABSTRACT

An ultrasonic transducer has a pair of transducer elements (30,31), polarised in opposite directions, which are mounted between, and in intimate contact with, respective front face electrodes (32) and back face electrodes (33). The front face electrodes are each earthed. The back face electrodes are each connected to a respective input/output terminal (34,35). The input/output terminals are supplied with activating pulses of opposite polarity, produced using a differential pulse generator (39) or a transformer arrangement (43), when the transducer is operating in the transmit mode. When the transducer is operating in the receive mode, pulses of opposite polarity are generated at the back face electrodes when an ultrasonic pressure wave is incident upon the front face electrodes. These pulses are differentially summed using a differential amplifier (40) or a transformer arrangement (43). Impedance matching is preferably used to optimise performance. Such a transducer has a substantially reduced pick-up of environmental noise and thus has an improved signal to noise ratio when in use.

4 Claims, 3 Drawing Sheets

ULTRASONIC ELECTROACOUSTIC TRANSDUCER

TECHNICAL FIELD

This invention concerns ultrasonic transducers. More particularly, it concerns ultrasonic transducers which are significantly less susceptible than conventional ultrasonic transducers to the adverse influence of environmental electrical noise.

BACKGROUND TO THE INVENTION

Ultrasonic transducers which, when operating in the transmit mode, convert electrical pulses into sound waves at ultrasonic frequencies (and which, when operating in the receive mode, generate electrical signals when a sound wave at an ultrasonic frequency is incident upon them) are well known. They are used in a variety of ultrasound echo ranging applications, including in ultrasound scanning equipment used for medical diagnosis and in non-destructive testing.

The conventional ultrasonic transducer comprises a single transducer element sandwiched between front and back electrodes. The element may be a polarised ferro-electric ceramic, or a polarised polymer piezoelectric composite ceramic and/or polymer material. An alternative known form of transducer, the dual back-face electrode transducer, comprises a pair of transducer elements poled in opposite directions, with connections only to the two back electrodes of the transducer.

A problem that has existed for a considerable time is that an ultrasonic transducer is susceptible to electrical noise in the environment in which the transducer is used. This is due to the unbalanced nature of the driving circuit, and is accentuated by a high output impedance of the transducer. Even when shielded (coaxial) cables are used with the transducer, there is a significant tendency for noise pick-up. Thus considerable care (and expense) is required to maintain a high signal to noise ratio in conditions where environmental electrical noise may swamp the ultrasonic signals that are generated or received by the transducer (particularly when the transducer is operating in the receive mode).

One technique for reducing noise in transducers—particularly directed to microphone electroacoustical transducers which include elements made from barium titanate or PZT ($PbZrO_3.PbTiO_3$)—is described in the specification of U.S. Pat. No. 4,751,418. That technique involves the use of a reference voltage source (which may be earth potential) connected to the input line from the transducer to a differential amplifier. The reference voltage is established using a load having substantially the same impedance as the transducer element. The load may be a second transducer element (as shown in FIG. 1 of the specification of U.S. Pat. No. 4,751,418) or it may comprise an RC circuit (as shown in FIG. 2 of that specification).

Although the approach to noise reduction described in the specification of U.S. Pat. No. 4,751,418 may be suitable for adoption with audio frequency microphones (note that reference is made in that specification to the use of that invention in the detection of heartbeat sounds), it does not confer immunity against noise pick up in the transducer elements themselves, as these have an unbalanced configuration.

DISCLOSURE OF THE PRESENT INVENTION

It is an object of the present invention to provide a novel form of ultrasonic transducer which is substantially less susceptible to the effects of environmental electrical noise than conventional ultrasonic transducers.

This objective of the present invention is achieved by using a pair of transducer elements in the transducer, each sandwiched between respective front and back electrodes in the same manner as in the dual back-face electrode transducer. However, instead of having the electrodes on the front face floating (as in the conventional transducer), each front face electrode is earthed. In addition, instead of having a single input and output for electrical signals supplied to and generated by the transducer, the transducer is provided with a pair of input/output terminals, each of which is connected to a respective back electrode of a transducer element.

When the transducer of the present invention is used to generate ultrasonic signals, the activating electrical pulse is converted into a pair of pulses of opposite polarity. These two pulses are applied simultaneously, via the input/output terminals, to their respective back electrodes of the transducer elements. And when the transducer of the present invention is used in the receive mode, the ultrasonic signal incident upon the front face electrodes produces a pair of electrical signals of opposite polarity at the back face electrodes. When these electrical signals are added in a differential amplifier, any common mode (noise) signals will be cancelled out. Hence the transducer of the present invention, when operating in both its transmit mode and its receive mode, is "balanced".

Thus, according to the present invention, there is provided an ultrasonic transducer comprising (a) at least one pair of transducer elements, said or each pair of transducer elements consisting of a first transducer element and a second transducer element, each transducer element being sandwiched between a respective front electrode and a respective back electrode, said or each first transducer element being polarised positive at its front electrode and negative at its back electrode, said or each second transducer element being polarised negative at its front electrode and positive at its back electrode; and (b) first and second input/output terminals; said first input/output terminal being connected to the back electrode of said or each first transducer element, said second input/output terminal being connected to the back electrode of said or each second transducer element; each of said front electrodes being connected to an earth connection point.

In addition, the transducer of the present invention includes means for converting an input electrical pulse into a pair of pulses of opposite polarity which are each connected to a respective one of said input/output terminals, and also means for differentially summing the electrical signals generated at the input/output terminals when an ultrasonic signal (pressure wave) is incident upon the front electrodes of the transducer.

Preferably, the conversion of an input signal into a pair of pulses and the differential summing of generated signals is effected using a transformer which matches the impedance of the transducer element and cable to the impedance of (i) the amplifier which supplies the input signal, and (ii) the amplifier to which the electrical signals generated by the transducer are connected.

Embodiments of the present invention will now be described, by way of example only, with reference to the accompanying drawings.

DETAILED DESCRIPTION OF THE ILLUSTRATED EMBODIMENTS

Figure 1:
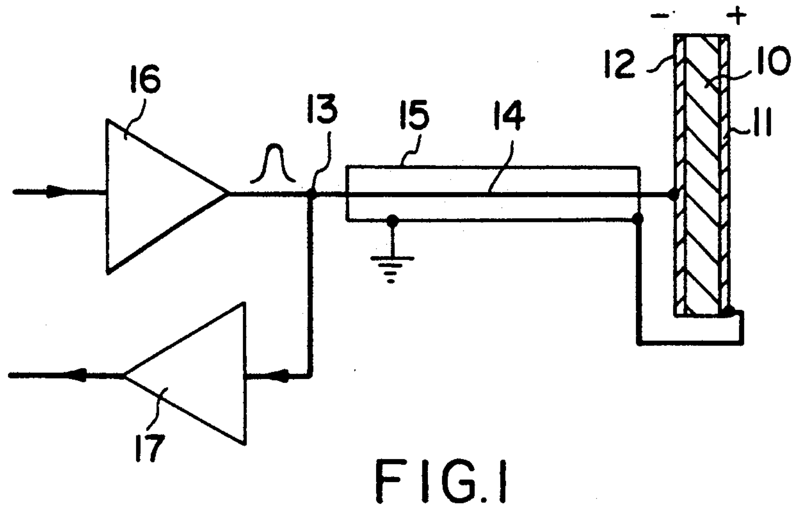
FIG.1 PRIOR ART
FIG. 1 is a diagram showing the essential features of a conventional single element ultrasonic transducer.

The conventional ultrasonic transducer shown in FIG. 1 has a single disc-like transducer element 10 mounted between, and in intimate contact with, a front electrode 11 and a back electrode 12. Although referred to as "disc-like", it will be appreciated that the transducer element may have any required peripheral shape, and that the term "disc-like" does not imply, in the context of this specification, a limitation to a circular shape. The back electrode is connected to an input/output terminal 13 by a screened lead 14. The front electrode 11 is connected to the outer conductor 15 of the screened lead, and thus is also earthed. The piezo-electric transducer element 10 is polarised positive on its front face (which is in intimate contact with the planar front electrode 11) and negative at its back face (which is in contact with the planar back electrode 12).

To produce an ultrasonic signal using the transducer of FIG. 1, an electrical signal is applied to the input/output terminal 13 through an amplifier 16. A positive pulse at terminal 13 (that is, a positive pulse applied to the back electrode 12) gives a negative pressure wave in the medium adjacent to the outer surface of the front electrode 11, and vice versa.

When operating in the receive mode, when a positive pressure is applied to the front electrode 11, a negative-going electrical pulse is generated at the input/output terminal 13. The signals generated at the terminal 13 upon receipt of ultrasonic energy at the front electrode 11 are amplified by a receiver amplifier 17.

Figure 2:
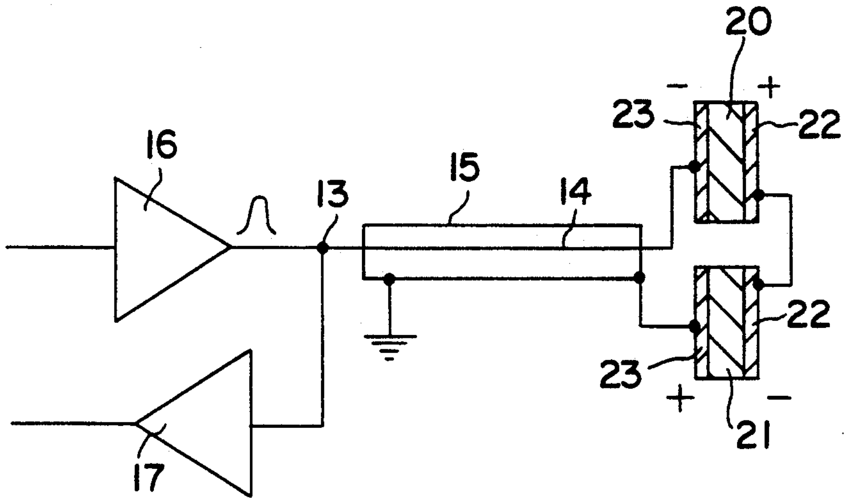
FIG.2 PRIOR ART
FIG. 2 is a diagram (similar to FIG. 1) of a conventional dual back-face electrode ultrasonic transducer.

The ultrasonic transducer illustrated in FIG. 2 is also known in this art. It was introduced to overcome problems encountered in attaching connectors to the electrode of the front (outer) surface of the transducer. It is described in, for example, the paper by R. W. Martin, F. E. Silver and A. H. Proctor entitled "Back face only electrical connections of thickness mode piezo-electric transducers", which was published in the *IEEE Transactions on Ultrasonics, Ferroelectrics and Frequency Control*, Volume UFFC-33, No 6, pages 778 to 781, 1986. This dual back-face electrode transducer comprises two piezo-electric transducer elements 20 and 21, each sandwiched between a respective front electrode 22 and a respective back electrode 23. The back electrode 23 of the transducer element 20 is connected to the input/output terminal 13 of the transducer by a screened lead 14. The front electrodes 22 are connected to each other. The back electrode 23 of the transducer element 21 is connected to the earthed shielding or outer conductor 15 of the screened lead. The transducer element 20 is polarised with its front face positive. The transducer element 21 is polarised with its front face negative. The transmitter amplifier 16 and the receiver amplifier 17 operate in the same manner as their counterparts in FIG. 1.

Thus, when operating in the transmit mode, an electrical pulse which is positive on the front face of the positively poled transducer element 20 produces a positive pressure wave. Also, because the electrodes 22 are connected together and the two transducer elements are in series, the same electrical pulse will produce a positive pressure wave from the front face of the element 21. For a more detailed commentary on the operation of the transducer of FIG. 2, reference should be made to the aforementioned paper by R. W. Martin, F. E. Silver and A. H. Proctor.

As noted above, ultrasonic transducers of the type illustrated in FIGS. 1 and 2 are sensitive to environmental electrical noise. They are connected in an unbalanced manner and require good earthing of the earthed electrode, and extensive shielding of the connections to the non-earthed electrode and of the contents of the transducer housing, to ensure a good signal to noise ratio, especially when the transducers are operating in the receive mode.

Figure 3:
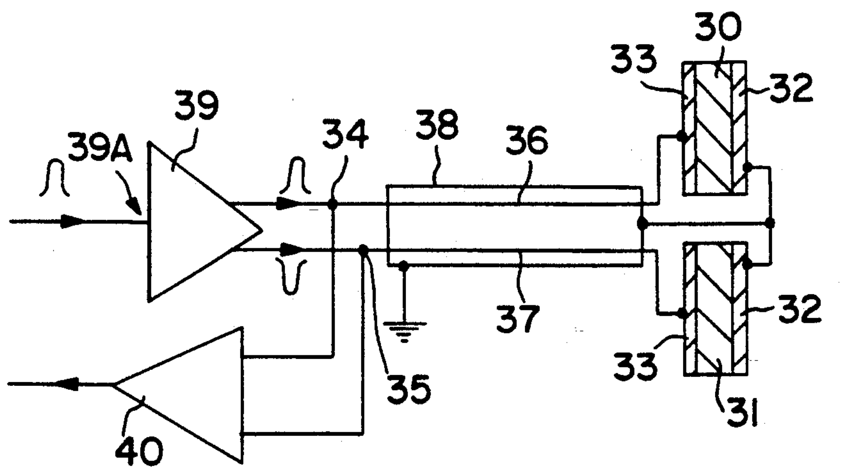
FIG. 3 is a diagram showing an ultrasonic transducer constructed in accordance with the present invention, arranged to operate in both the transmit and receive mode.

The embodiment of the present invention which is illustrated in FIG. 3 comprises a first transducer element 30 and a second transducer elements 31, each having an associated front electrode 32 and back electrode 33. The transducer elements 30 and 31 are each disc-like (but not necessarily circular) elements of piezo-electric material of the type commonly used in conventional ultrasonic transducers. The elements 30 and 31 are of uniform thickness, with planar front and back faces, and although the shape of the element faces is not critical (several useful shapes are shown in the drawings), the area of the front face of the transducer element 30 should be essentially equal to the area of the front face of the transducer element 31. The elements 30 and 31 will always be mounted closely adjacent to each other.

Each of the front electrodes 32 and the back electrodes 33 are in intimate contact with, and cover the entire front or back face of, their associated transducer element 30 and 31, in accordance with conventional practice.

The first transducer element 30 is polarised with its front face positive and its back face negative. The second transducer element 31 is polarised with its front face negative and its back face positive.

Thus the basic arrangement of transducer elements and front and back electrodes of a two-element transducer constructed in accordance with the present invention is essentially the same as that of a conventional dual back-face electrode ultrasonic transducer. However, the way in which the electrodes 32 and 33 are connected, and thus the way in which electrical signals are applied to (and received from) the back electrodes 33, is different from the prior art arrangements.

As shown in FIG. 3, the transducer of the present invention has a pair of input/output terminals 34 and 35. The first input/output terminal 34 is connected via lead 36 to the back electrode 33 of the first transducer element 30. The second input/output terminal 35 is connected to the back electrode 33 of the second transducer element 31. The connections 36 and 37 between the input/output terminals 34 and 35 and their associated back electrodes 33 are formed by a twin shielded cable (an earthed screen or outer conductor 38 is shown in FIG. 3). The front electrodes 32 are each connected to earth via the outer conductor 38 of this screened lead.

The two outputs of a differential pulse generator 39 are connected to the input/output terminals 34 and 35. The differential pulse generator is a known device. It receives an activating pulse for the transducer at its input 39A and produces a pair of pulses of opposite polarity at its outputs. When the opposite polarity pulses (which are of equal amplitude) are applied to the back electrodes 33, each of the transducer elements 30 and 31 is excited to generate a pressure wave of the same polarity for each transducer element. In this respect, the transducer of FIG. 3 operates effectively as a single element ultrasonic transducer. The transducer of FIG. 3 is thus a balanced system.

When operating in the receive mode, the transducer elements 30 and 31 generate electrical signals of opposite polarity at their back electrodes 33 upon receipt of a pressure wave at their front electrodes 32. Using conventional techniques, the signals generated at the back electrodes 33 are applied to the inputs of a differential receiver 40, and not to the outputs of the differential pulse generator 39. The differential receiver 40 adds the differential received pulses to produce a single output signal at its output 40A, and rejects common mode signals.

Thus the ultrasonic transducer shown in FIG. 3 has a significantly higher signal to noise ratio in the receive mode than the conventional dual back-face electrode transducer.

Figure 4A:
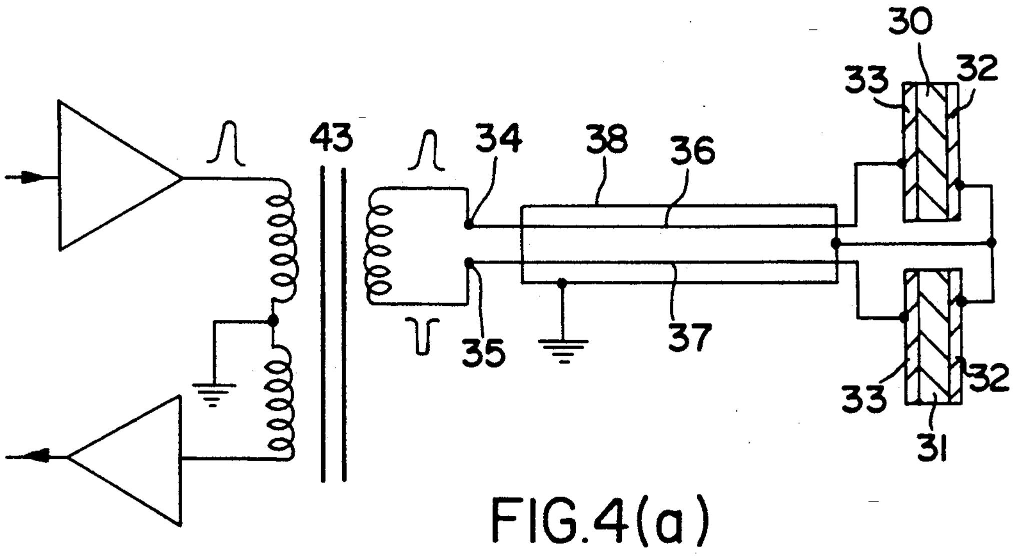
FIG. 4*a* is a diagram similar to FIG. 3, but with a transformer included in the transmit and receive arrangement connected to the transducer, which may be used when the transducer impedance is sufficiently low.

FIG. 4*a* shows a transducer of the same construction as the transducer of FIG. 3, but with a transformer arrangement for supplying input signals of opposite polarity to the input/output terminals 34 and 35, and for adding the differentially generated electrical signals at the terminals 34 and 35 when operating in the receive mode. The transformer 43 converts a single positive electrical pulse into a pair of equal pulses of opposite polarity at the terminals 34 and 35. It also adds the differentially generated pulses obtained when the transducer is operating in its receive mode while common mode signals cancel each other. This configuration provides optimum signal to noise ratio and signal matching for relatively large transducers.

Large transducers have relatively low impedances which closely resemble the cable impedance. Those skilled in this art will be aware of the importance of matching the transmission and receiving system to the cable and transducer element to optimise the performance of the transducer.

The arrangement shown in FIG. 4*a* can be used for such tuning, by ensuring that the transformer 43 is chosen to match the output impedance of the amplifier 39 and the input impedance of the amplifier 40 to the impedance of the cable 38 and assembly of transducer elements 30.

Small transducer elements, such as those used in transducer arrays, have a higher electrical impedance, whereas the typical cable has a low impedance. If these two circuit components are not matched, the sensitivity of the transducer arrangement is reduced, in some cases by up to 20 db. Thus the cable and transducer elements should be tuned to minimise the mismatch. The arrangement shown in FIG. 4*b* can be used for such tuning, by ensuring that the transformer 43 is positioned as close to the transducer element assembly as possible and is chosen to match the impedance of the cable 38.

Figure 4B:
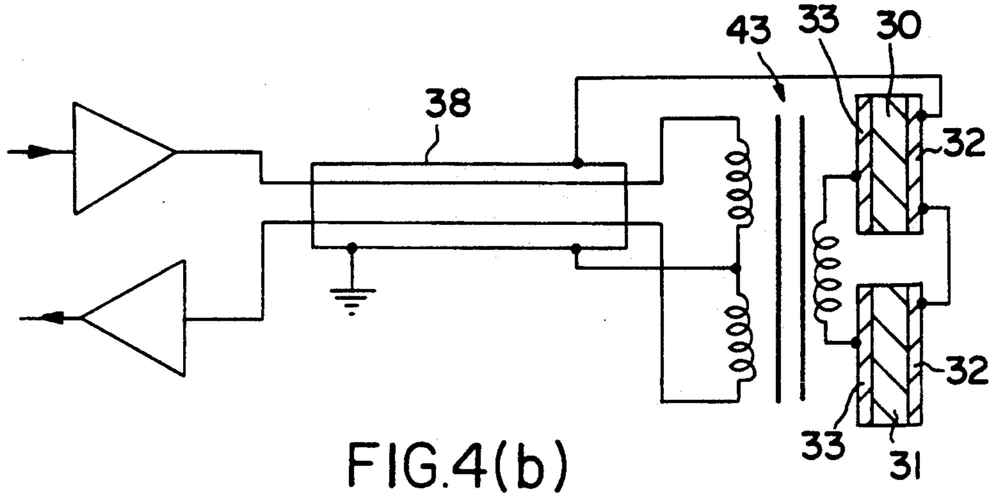
FIG. 4*b* is a preferred alternative to the arrangement of FIG. 4*a*, which may be used when the transducer impedance is high.

In a linear array of ultrasonic transducer elements constructed in accordance with the present invention, each transducer element of the array was provided with a transformer as shown in FIG. 4*b*. Transducer elements were made from PZT5 material, with a length of 14 mm and a width of 1 mm. Each transformer comprised a ferrite core having a volume of 14 cubic mm and was wound to match the impedance of the transducer elements with the associated cable. This linear array has produced substantially better signal to noise performance than any other linear array of ultrasound transducers used by the present inventor.

A further improvement in the signal to noise performance can be achieved by matching the low signal cable impedance, using a step up transformer at the input to each receiver. A four to one step up is a realistic practical requirement for such a transformer.

The present inventor has also found that the operation of ultrasonic echoscopy equipment having conventional ultrasound transducer arrangements can be improved by the use of a matching transformer in the manner shown in FIGS. 4*a* and 4*b* (but with a conventional ultrasonic transducer in place of the element constructed in accordance with the present invention). This modification of a conventional ultrasonic transducer constitutes a further aspect of the present invention.

Figure 5:
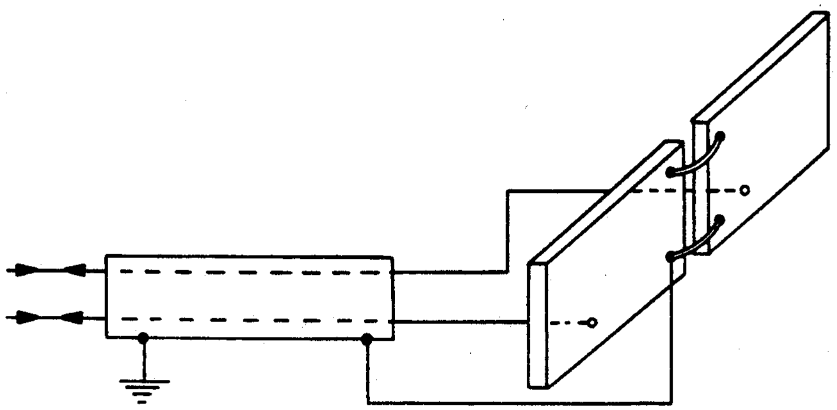
FIG. 5 is a partly perspective, partly schematic, illustration of a transducer of the present invention having two rectangular transducer elements, mounted side by side.
Figure 6:
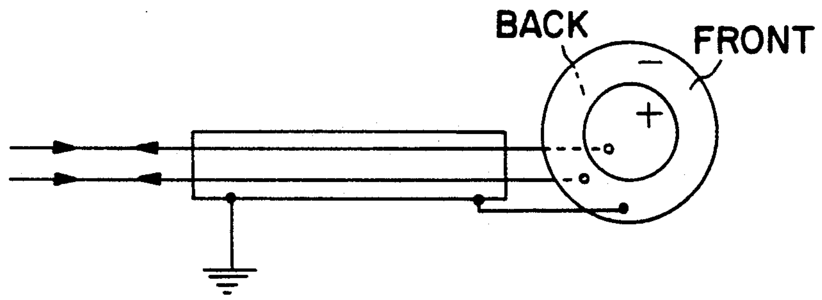
FIGS. 6 and 7 illustrate transducers with different transducer element and electrode shapes, constructed in accordance with the present invention.
Figure 7:
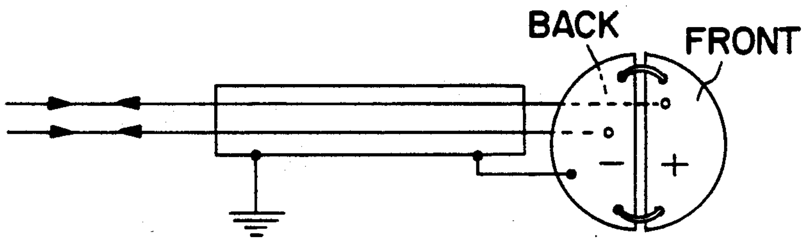

FIGS. 5, 6 and 7 illustrate examples of different transducer element shapes that may be used in a transducer of the present invention having two transducer elements. The useful transducer element shapes are not limited to those depicted in FIGS. 5, 6 and 7.

Figure 8:
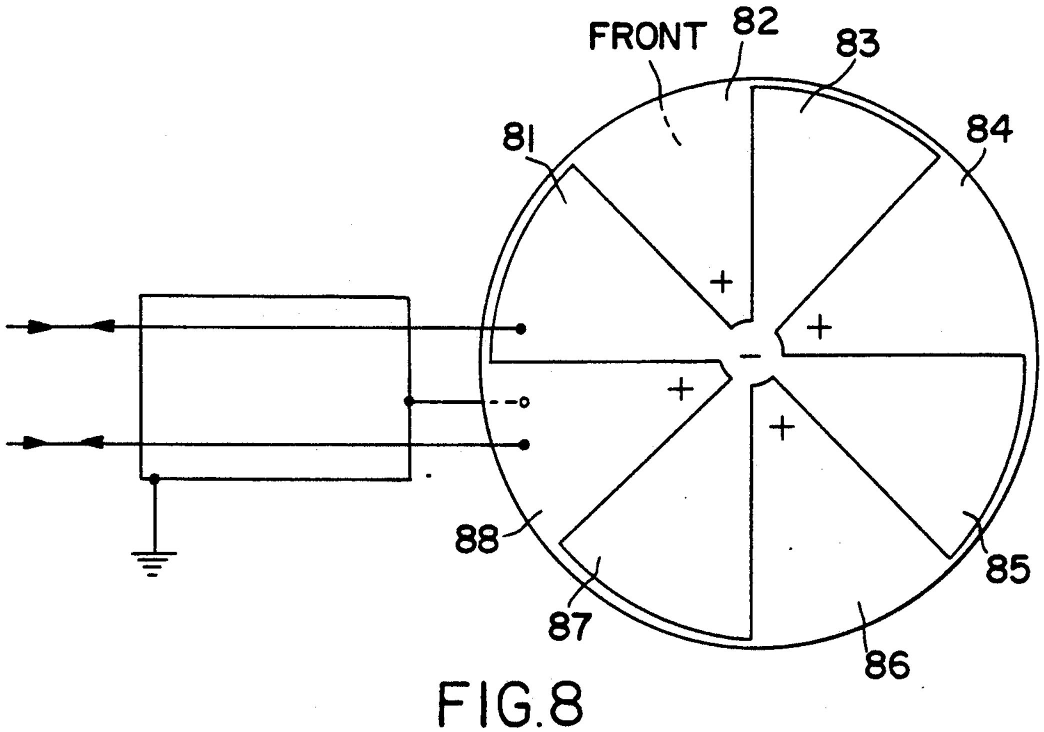
FIG. 8 shows a disc transducer constructed in accordance with the present invention, having eight elements, connected as four pairs of elements.

FIG. 8 shows one example of the way in which a transducer having more than two elements can be constructed in accordance with the present invention. In the FIG. 8 embodiment, the disc-like transducer element has been divided into eight sub-elements of equal area. The sub-elements 82, 84, 86 and 88 are poled positively and have their back electrodes connected together and to one input/output terminal of the transducer. The sub-elements 81, 83, 85 and 87 are poled negatively and have their back electrodes connected together and to the other input/output terminal of the transducer. The front electrodes of all of the sub-elements are connected to earth, via the screening conductor 38.

To construct a transducer of the form illustrated in FIGS. 6 and 8, the individual transducer elements are best formed using a single crystal, with the poling of the individual transducer elements effected using the technique described in the aforementioned paper by R. W.

Martin, F. E. Silver and A. H. Proctor, or a modification of that technique.

The embodiments of the present invention described above all feature a single ultrasonic electroacoustical transducer. It will be appreciated that the present inventive concept of balanced transducer elements and electronic components can be applied in the implementation of array transducers, including annular, linear, curved linear, and phased array transducers as commonly used in this art.

It will also be appreciated that although a number of embodiments of the ultrasonic transducer of the present invention have been illustrated and described in this specification, the present invention is not limited to those embodiments. Variations to and modifications of the illustrated embodiments are possible without departing from the present inventive concept.

I claim:

1. An ultrasonic transducer comprising:

(a) at least one pair of transducer elements, said or each pair of transducer elements consisting of a first transducer element and a second transducer element, each transducer element being sandwiched between a respective front electrode and a respective back electrode, said or each first transducer element being polarised positive at its front electrode and negative at its back electrode, said or each second transducer element being polarised negative at its front electrode and positive at its back electrode;

(b) first and second input/output terminals; said first input/output terminal being connected to the back electrode of said or each first transducer element, said second input/output terminal being connected to the back electrode of said or each second transducer element; each of said front electrodes being connected to an earth connection point; and (c) a differential pulse generator having an input, and a pair of outputs and a differential summing device having a pair of inputs and an output, said first input/output terminal being connected to one of the outputs of the differential pulse generator and also to one of the inputs of the differential summing device, said second input/output terminal being connected to the other of the outputs of the differential pulse generator and also to the other of the inputs of the differential summing device;

whereby (i) a voltage pulse applied to the input of the differential pulse generator produces a pair of pulses of opposite polarity at, respectively, the two outputs of the differential pulse generator, each of said pulses of opposite polarity being applied to a respective one of the back electrodes, and (ii) an ultrasound pressure wave incident upon the front electrodes generates a pair of opposite polarity pulses at the back electrodes, each of said pulses at the back electrodes being connected to a respective one of the inputs of the differential summing device, to generate a single pulse at the output of the differential summing device.

2. An ultrasonic transducer comprising:

(a) at least one pair of transducer elements, said or each pair of transducer elements consisting of a first transducer element and a second transducer element, each transducer element being sandwiched between a respective front electrode and a respective back electrode, said or each first transducer element being polarised positive at its front electrode and negative at its back electrode, said or each second transducer element being polarised negative at its front electrode and positive at its back electrode;

(b) first and second input/output terminals; said first input/output terminal being connected to the back electrode of said or each first transducer element, said second input/output terminal being connected to the back electrode of said or each second transducer element; each of said front electrodes being connected to an earth connection point;

(c) a first operational amplifier, having an input and an output;

(d) a second operational amplifier having an input and an output; and (e) a transformer having a single primary winding and first and second secondary windings; said secondary windings being connected in series and being earthed at their point of connection to each other; the output of said first operational amplifier being connected to the end of said first secondary winding which is not connected to earth; the input of said second operational amplifier being connected to the end of said second secondary winding which is not connected to earth; said first input/output terminal being connected to one end of said primary winding; and said second input/output terminal being connected to the other end of said primary winding;

whereby (i) a positive pulse at the output of the first operational amplifier generates a pair of opposite polarity pulses at the ends of said primary winding, each of said pulses of opposite polarity being applied to a respective one of said back electrodes, and (ii) an ultrasound pressure wave received at said front electrodes generates a pair of opposite polarity pulses at said back electrodes, each of such pulses at said back electrodes being connected to a respective end of said primary winding and causing a single pulse, proportional to the differential sum of the pulses at said back electrodes, to be generated by said second secondary winding and applied to the input to said second operational amplifier.

3. An ultrasonic transducer as defined in claim 2, in which said transformer is wound to match the input and output impedance of said first and second operational amplifiers to the electrical impedance of the transducer elements.

4. An ultrasonic transducer as defined in claim 3, including a respective step up transformer associated with the input and output of said first and second operational amplifiers, for improving the matching of the input and output impedances of said operational amplifiers to the electrical impedance of the transducer elements.

* * * * *

UNITED STATES PATENT AND TRADEMARK OFFICE
CERTIFICATE OF CORRECTION

PATENT NO. : 5,298,828

DATED : March 29, 1994

INVENTOR(S) : George D. Radovanovich

It is certified that error appears in the above-identified patent and that said Letters Patent is hereby corrected as shown below:

On the title page, item [22], please correct the International filing date from "Oct. 12, 1990" to --Nov. 1, 1991--.

On the title page, item [86], please correct the International application number from "PCT/AU90/00489" to --PCT/AU91/00508--.

Signed and Sealed this

Thirtieth Day of August, 1994

*Attest:*

Bruce Lehman

BRUCE LEHMAN

*Attesting Officer*

*Commissioner of Patents and Trademarks*